United States Patent
Illek et al.

(10) Patent No.: US 9,786,824 B2
(45) Date of Patent: Oct. 10, 2017

(54) METHOD FOR PRODUCING AN OPTOELECTRONIC COMPONENT

(71) Applicant: OSRAM Opto Semiconductors GmbH, Regensburg (DE)

(72) Inventors: Stefan Illek, Donaustauf (DE); Hans-Jürgen Lugauer, Sinzing (DE); Jürgen Moosburger, Lappersdorf (DE); Thomas Schwarz, Regensburg (DE); Tansen Varghese, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 15 days.

(21) Appl. No.: 14/769,198

(22) PCT Filed: Jan. 15, 2014

(86) PCT No.: PCT/EP2014/050700
§ 371 (c)(1),
(2) Date: Aug. 20, 2015

(87) PCT Pub. No.: WO2014/127933
PCT Pub. Date: Aug. 28, 2014

(65) Prior Publication Data
US 2016/0005936 A1  Jan. 7, 2016

(30) Foreign Application Priority Data
Feb. 22, 2013  (DE) .................. 10 2013 202 906

(51) Int. Cl.
*H01L 33/54* (2010.01)
*H01L 33/00* (2010.01)
*H01L 33/50* (2010.01)
*H01L 33/62* (2010.01)

(52) U.S. Cl.
CPC ............ *H01L 33/54* (2013.01); *H01L 33/005* (2013.01); *H01L 33/0095* (2013.01); *H01L 33/50* (2013.01); *H01L 33/62* (2013.01); *H01L 2924/0002* (2013.01);
(Continued)

(58) Field of Classification Search
CPC ..... H01L 33/54; H01L 33/62; H01L 33/0095; H01L 21/568; H01L 2933/0025
See application file for complete search history.

(56) References Cited

U.S. PATENT DOCUMENTS

| | | | |
|---|---|---|---|
| 7,816,704 B2 | 10/2010 | Hsu et al. | |
| 8,535,961 B1 * | 9/2013 | Kuo | H01L 33/486 257/88 |
| 8,723,192 B2 | 5/2014 | Weidner et al. | |

(Continued)

FOREIGN PATENT DOCUMENTS

| | | |
|---|---|---|
| CN | 101300688 A | 11/2008 |
| CN | 102468189 A | 5/2012 |

(Continued)

*Primary Examiner* — Stephen Bradley
(74) *Attorney, Agent, or Firm* — Slater Matsil, LLP

(57) ABSTRACT

A method can be used for producing an optoelectronic component. An optoelectronic semiconductor chip has a front face and a rear face. A sacrificial layer is applied to the rear face. A molded body is formed the optoelectronic semiconductor chip being at least partially embedded in the molded body. The sacrificial layer is removed.

15 Claims, 6 Drawing Sheets

(52) U.S. Cl.
CPC ............... *H01L 2933/005* (2013.01); *H01L 2933/0041* (2013.01); *H01L 2933/0066* (2013.01)

(56) References Cited

U.S. PATENT DOCUMENTS

| | | | |
|---|---|---|---|
| 8,829,666 B2 | 9/2014 | Ng et al. | |
| 2009/0212316 A1* | 8/2009 | Braune | H01L 24/97 |
| | | | 257/99 |
| 2010/0155917 A1 | 6/2010 | Maruo | |
| 2011/0108932 A1 | 5/2011 | Benzel et al. | |
| 2012/0202336 A1 | 8/2012 | Park et al. | |
| 2012/0220082 A1* | 8/2012 | Ng | H01L 21/561 |
| | | | 438/124 |
| 2012/0261699 A1* | 10/2012 | Ooyabu | H01L 33/56 |
| | | | 257/98 |
| 2012/0264271 A1 | 10/2012 | Kuh et al. | |
| 2012/0326170 A1* | 12/2012 | Liu | H01L 25/167 |
| | | | 257/82 |
| 2012/0326178 A1* | 12/2012 | Fehrer | H01L 24/24 |
| | | | 257/88 |
| 2013/0193470 A1 | 8/2013 | Weidner et al. | |
| 2014/0097536 A1* | 4/2014 | Schunk | H01L 31/02325 |
| | | | 257/738 |
| 2015/0041832 A1 | 2/2015 | Gruendl et al. | |

FOREIGN PATENT DOCUMENTS

| | | |
|---|---|---|
| DE | 102009036621 A1 | 2/2011 |
| DE | 102010033963 A1 | 2/2012 |
| DE | 102012102420 A1 | 9/2013 |
| EP | 2107620 A2 | 10/2009 |

\* cited by examiner

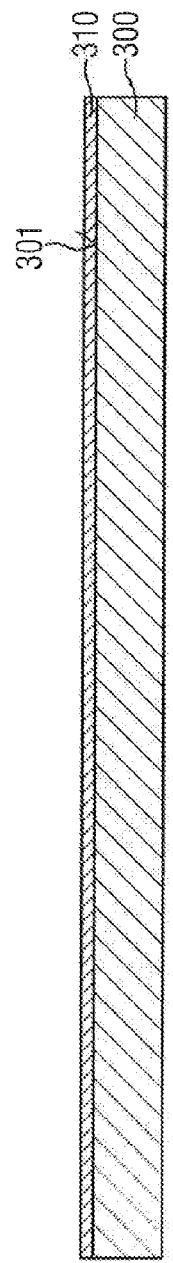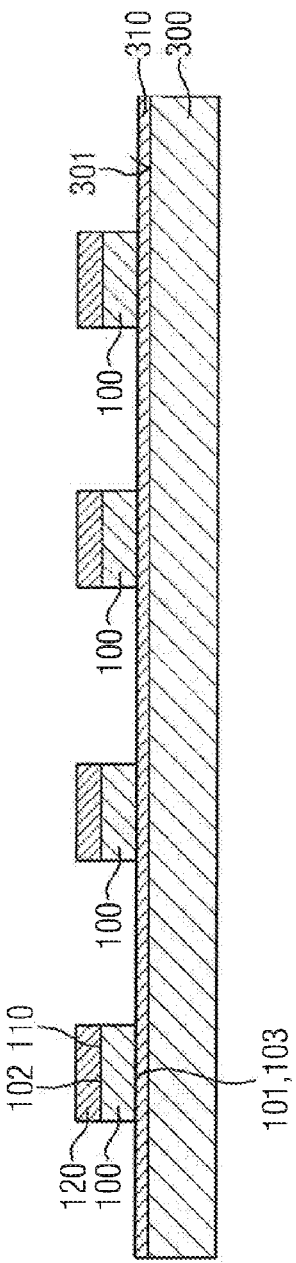

METHOD FOR PRODUCING AN OPTOELECTRONIC COMPONENT

This patent application is a national phase filing under section 371 of PCT/EP2014/050700, filed Jan. 15, 2014, which claims the priority of German patent application 10 2013 202 906.3, filed Feb. 22, 2013, each of which is incorporated herein by reference in its entirety.

TECHNICAL FIELD

The present invention relates to a method for producing an optoelectronic component.

BACKGROUND

It is known to equip electronic components with housings which fulfill a plurality of different functions. Known housings can provide, for example, an electrical connection to a semiconductor chip comprised by the electronic component and an interface to a circuit carrier. Known housings can also serve for thermal management and as protection against damage resulting from electrostatic discharges. In the case of optoelectronic components such as light emitting diodes, sensors or photovoltaic concentrators, housings can also fulfill further functions such as coupling light in and out, influencing a spatial light distribution or converting a light wavelength.

German patent document DE 10 2009 036 621 A1 discloses a method for producing an optoelectronic semiconductor component in which optoelectronic semiconductor chips are arranged on a top side of a carrier. The optoelectronic semiconductor chips are encapsulated with a molded body that covers all side surfaces of the optoelectronic semiconductor chips. Top sides and undersides of the optoelectronic semiconductor chips preferably remain free. After the removal of the carrier, the optoelectronic semiconductor components can be singulated. Contact locations can be provided at the top side and/or underside of each semiconductor chip. The molded body can consist, for example, of an epoxide-based molding material.

SUMMARY

A method for producing an optoelectronic component comprises steps for providing an optoelectronic semiconductor chip having a front side and a rear side, for applying a sacrificial layer on the rear side, for forming a molded body, wherein the optoelectronic semiconductor chip is at least partly embedded into the molded body, and for removing the sacrificial layer. Advantageously, this method creates a cavity in the molded body, which cavity is aligned in a self-aligning fashion with high accuracy with respect to the optoelectronic semiconductor chip embedded into the molded body.

In one embodiment of the method, before removing the sacrificial layer a step is carried out for partly removing the molded body in order to make the sacrificial layer accessible. Advantageously, the rear side of the semiconductor chip is protected by the sacrificial layer during the process of partly removing the molded body in this method, thereby preventing damage to the rear side of the semiconductor chip during the process of partly removing the molded body.

In one embodiment of the method, the optoelectronic semiconductor chip is embedded into the molded body in such a way that the front side of the optoelectronic semiconductor chip is flush with an underside of the molded body. Advantageously, the front side of the optoelectronic semiconductor chip is thereby exposed after the process of embedding the optoelectronic semiconductor chip into the molded body. As a result, the front side of the optoelectronic semiconductor chip can advantageously serve as a radiation passage surface of the optoelectronic component.

In one embodiment of the method, before forming the molded body a further step is carried out for arranging the optoelectronic semiconductor chip on a carrier, wherein the front side of the optoelectronic semiconductor chip faces a surface of the carrier. Advantageously, the front side of the optoelectronic semiconductor chip is thereby protected during the process of embedding the optoelectronic semiconductor chip into the molded body, as a result of which the front side of the optoelectronic semiconductor chip is subsequently not covered by the molded body.

In one embodiment of the method, a first lateral section of the surface of the carrier is elevated relative to a second lateral section of the surface of the carrier. Advantageously, the lateral structuring of the surface of the carrier during the process of forming the molded body is transferred as a negative to an underside of the molded body. This advantageously makes it possible to produce a molded body having a laterally structured underside. The lateral structuring of the underside of the molded body can then advantageously serve for the self-aligning arrangement of additional component parts of the optoelectronic component. By way of example, the lateral structure of the molded body can serve as optical reflector, for receiving wavelength-converting material or for fixing optical lenses.

In one embodiment of the method, a further step for detaching the molded body from the carrier is carried out. Advantageously, the carrier can subsequently be reused.

The front side of the optoelectronic semiconductor chip is provided for the passage of electromagnetic radiation. Advantageously, the optoelectronic semiconductor chip can then be an LED chip or a photovoltaic chip, for example.

In one embodiment of the method, the optoelectronic semiconductor chip is provided with a metallization arranged on the rear side. Advantageously, the metallization arranged on the rear side is protected by the sacrificial layer arranged on the rear side of the optoelectronic semiconductor chip during the process of partly removing the molded body and, as a result, is not damaged during the process of partly removing the molded body. This allows the metallization already to be arranged on the rear side of the optoelectronic semiconductor chip while the optoelectronic semiconductor chip is still in a wafer assemblage with further optoelectronic semiconductor chips. This is advantageously possible in a simple and cost-effective manner. The metallization then need not be arranged on the rear side of the optoelectronic semiconductor chip only after the process of embedding the optoelectronic semiconductor chip into the molded body, as a result of which a lithographic process step can advantageously be saved.

In one embodiment of the method, after the process of removing the sacrificial layer a further step is carried out for the electroless deposition of a metal on the rear side of the optoelectronic semiconductor chip. Advantageously, the metallization arranged on the rear side of the semiconductor chip can be thickened by the electroless deposition of the metal in a simple and cost-effective manner. This advantageously makes use of the fact that as a result of the preceding process of removing the sacrificial layer in the region of the rear side of the optoelectronic semiconductor chip a cavity is arranged in the molded body, which cavity serves as a self-aligned mask for the deposition of the metal.

In one embodiment of the method, a further step is carried out for surface grinding the metal deposited on the rear side of the optoelectronic semiconductor chip, and the molded body. A molded body having a particularly planar surface is advantageously obtainable as a result.

In one embodiment of the method, the optoelectronic semiconductor chip is detached from a wafer assemblage between the process of applying the sacrificial layer and the process of forming the molded body. This advantageously makes it possible already to apply the sacrificial layer to the rear side of the optoelectronic semiconductor chip while the latter is still in the wafer assemblage with further optoelectronic semiconductor chips. As a result, the process of applying the sacrificial layer is possible in a simple and particularly cost-effective manner.

In one embodiment of the method, an electrically conducting conductive element with a conductive element sacrificial layer arranged on the conductive element is embedded together with the optoelectronic semiconductor chip into the molded body. Afterward, the conductive element sacrificial layer is removed together with the sacrificial layer. Advantageously, the conductive element can serve as an electrical plated-through hole through the molded body of the optoelectronic component.

In one embodiment of the method, a plurality of optoelectronic semiconductor chips are embedded together into the molded body. In this case, the molded body is divided later in order to obtain a plurality of optoelectronic components. Advantageously, the method thereby allows parallel production of a multiplicity of optoelectronic components in a common work operation. The production costs per optoelectronic component can be drastically reduced as a result.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings. Here in each case in highly schematic illustration:

FIG. 1 shows a sectional view of a carrier;

FIG. 2 shows a view of the carrier with adhesion layer arranged thereon;

FIG. 3 shows a view of the carrier with optoelectronic semiconductor chips arranged on the adhesion layer;

DETAILED DESCRIPTION OF ILLUSTRATIVE EMBODIMENTS

Figure 4:
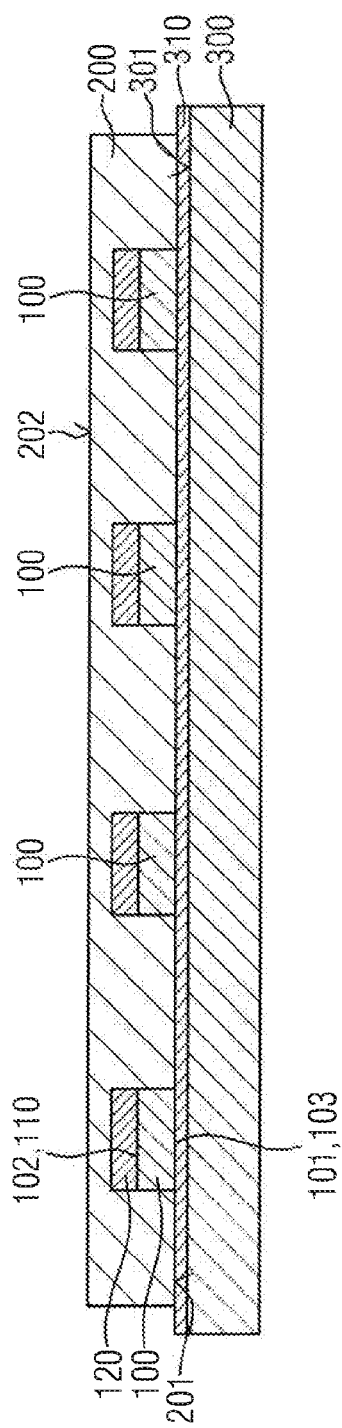
FIG. 4 shows a sectional view of the carrier with a molded body formed thereon.

FIG. 1 shows a schematic sectional illustration of a carrier 300. The carrier 300 can be embodied, for example, in the form of a wafer as a thin slice. The carrier 300 can comprise silicon, for example. However, the carrier 300 can also comprise a metal or some other material. The carrier 300 has a substantially planar surface 301.

FIG. 2 shows a schematic sectional illustration of the carrier 300, in a method state temporally succeeding the illustration in FIG. 1. An adhesion layer 310 has been applied on the surface 301 of the carrier 300. The adhesion layer 310 can be embodied, for example, as a film with a thermally releasable adhesive layer on one side and a customary adhesive layer on the other side. The thermally releasable layer in this case preferably faces the surface 301 of the carrier 300. The adhesion layer 310 can also be present in the form of a thermally releasable adhesive, an adhesive releasable by irradiation with light, for example, UV light, an adhesive releasable by wet-chemical treatment, or an adhesive releasable by a laser treatment. The adhesive of the adhesion layer 310 can also be releasable by a shear or tensile force being exerted.

The adhesion layer 310 may have been laminated onto the surface 301 of the carrier 300 by rollers or by means of a vacuum or a gas pressure. The adhesion layer 310 may also have been sprayed onto the surface 301 of the carrier 300 or applied by spin coating. The adhesion layer 310 may also have been arranged on the surface 301 of the carrier 300 by chemical or physical vapor deposition. Applying the adhesion layer 310 by printing, stamping, dispensing, jetting or some other method is also possible.

FIG. 3 shows the carrier 300 with the adhesion layer 310 arranged on the surface 301 in a further subsequent method state. Optoelectronic semiconductor chips 100 have been arranged on that side of the adhesion layer 310 which faces away from the surface 301 of the carrier 300. The optoelectronic semiconductor chips 100 are spaced apart from one another in a lateral direction and are preferably arranged in a regular two-dimensional grid.

Each optoelectronic semiconductor chip 100 has a front side 101 and a rear side 102 opposite the front side. The front side 101 of each optoelectronic semiconductor chip 100 faces the surface 301 of the carrier 300 and is thus in contact with the adhesion layer 310.

The optoelectronic semiconductor chips 100 can be, for example, light emitting diode chips (LED chips), laser chips or photovoltaic chips. In this case, the front side 101 of each optoelectronic semiconductor chip 100 is preferably a radiation passage surface 103. If the optoelectronic semiconductor chips 100 are light emitting diode chips, for example, the front side 101 of each optoelectronic semiconductor chip 100 can be a light emitting surface of the optoelectronic semiconductor chip 100.

The rear side 102 of each optoelectronic semiconductor chip 100 preferably has an ohmic contact 110. The ohmic contacts 110 are in each case embodied as metallization and provide electrically conducting connections to the optoelectronic semiconductor chips 100.

A sacrificial layer 120 is arranged on the rear side 102 of each optoelectronic semiconductor chip 100. The sacrificial layer 120 can comprise, for example, a polymer or a dielectric. The sacrificial layer 120 can have a thickness of between a few μm and a few 100 μm.

In the case of each of the optoelectronic semiconductor chips 100, the sacrificial layer 120 was preferably applied on the rear side 102 before the optoelectronic semiconductor chip 100 was detached from a wafer assemblage with further optoelectronic semiconductor chips 100. The sacrificial layer 120 was therefore preferably applied to a wafer comprising a multiplicity of optoelectronic semiconductor chips 100. The sacrificial layer 120 may have been applied, for example, by spin coating or by spray coating. The sacrificial layer 120 may have been additionally cured, for example, by heating, after the process of applying the sacrificial layer 120. The optoelectronic semiconductor chips 100 were subsequently detached from the wafer assemblage. Therefore, the sacrificial layer 120 of each optoelectronic semiconductor chip 100 that is arranged on the rear side 102 has substantially the same lateral dimensions as the rear side 102 of the optoelectronic semiconductor chips 100 themselves.

FIG. 4 shows a further sectional illustration of the carrier 300 in a temporally succeeding method state. A molded body 200 has been formed on the surface 301 of the carrier 300. The molded body 200 has preferably been produced by an injection molding process, a transfer molding process or some other molding process. The molded body 200 may have been produced, for example, in a lamination apparatus or an apparatus for compression, transfer or injection molding. The molded body 200 comprises an electrically insulating material. By way of example, the molded body 200 can comprise an epoxide-based material.

The molded body 200 has an underside 201 and a top side 202 opposite the underside 201. The underside 201 of the molded body 200 adjoins the adhesion layer 310 of the carrier 300. The front sides 101 of the optoelectronic semiconductor chips 100 terminate flush with the underside 201 of the molded body 200 and are accessible at the underside 201 of the molded body 200.

In the example illustrated, the top side 202 of the molded body 200 covers the sacrificial layers 120 arranged on the rear sides 102 of the optoelectronic semiconductor chips 100. The molded body 200 thus has, in a direction perpendicular to the surface 301 of the carrier 300, a greater thickness than the optoelectronic semiconductor chips 100 with the sacrificial layers 120 arranged thereon.

In the form illustrated in the exemplary illustration in FIG. 3, the molded body 200 may have been produced by means of compression molding, for example. Production of the molded body 200 by film assisted transfer molding would alternatively make it possible to form the top side 202 of the molded body 200 flush with that surface of the sacrificial layers 120 which faces away from the optoelectronic semiconductor chips.

Figure 5:
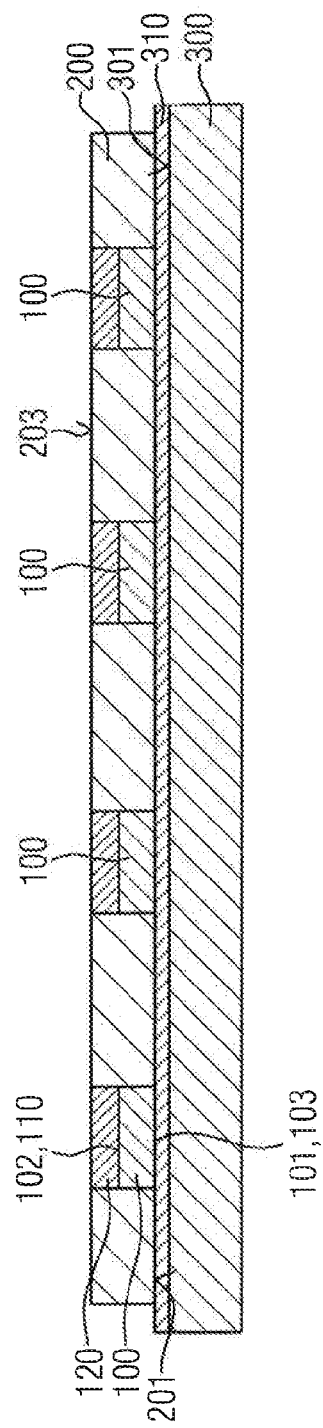
FIG. 5 shows a sectional view of the molded body after the top side thereof has been partly removed.

FIG. 5 shows a sectional illustration of the carrier 300 and of the molded body 200 formed on the surface 301 of the carrier 300 in a temporally succeeding further method state. Part of the molded body 200 has been removed, proceeding from the top side 202 of the molded body 200, in order to make the sacrificial layer 120 of each optoelectronic semiconductor chip 100 accessible. After the process of partly removing the molded body 200, the latter now has a ground top side 203 at which the sacrificial layer 120 of each optoelectronic semiconductor chip 100 is accessible. If the molded body, already during the process of forming the molded body 200, had been formed with a top side 202 at which the sacrificial layers 120 of the optoelectronic semiconductor chips 100 are accessible, the process of partly removing the molded body 200 can be dispensed with.

The process of partly removing the molded body 200 can be carried out, for example, by grinding the molded body 200. The process of partly removing 200 the molded body is carried out until the sacrificial layer 120 of each optoelectronic semiconductor chip 100 is accessible. Optionally, the process of partly removing the molded body 200 can also be continued until a portion of the sacrificial layers 120 of the optoelectronic semiconductor chips 100 has also been removed. The sacrificial layers 120 arranged on the rear sides 102 of the optoelectronic semiconductor chips 100 protect the optoelectronic semiconductor chips 100 against damage during the process of partly removing the molded body 200. In particular, the sacrificial layers 120 prevent damage to the ohmic contacts 110 arranged on the rear sides 102 of the optoelectronic semiconductor chips 100.

Figure 6:
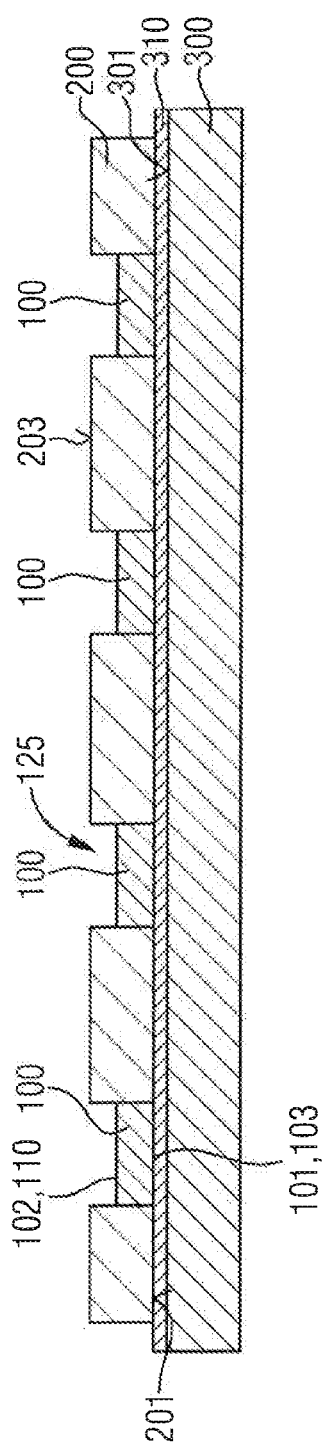
FIG. 6 shows the molded body after a sacrificial layer has been removed.

The sacrificial layers 120 of the optoelectronic semiconductor chips 100 that are accessible at the ground top side 203 of the molded body 200 can be removed in a subsequent method step. By way of example, the sacrificial layers 120 can be dissolved by a solvent. FIG. 6 shows a schematic sectional illustration of the molded body 200 arranged on the carrier 300 after the process of removing the sacrificial layers 120.

The process of removing the sacrificial layers 120 has given rise to cavities 125 on the ground top side 203 of the molded body 200. A respective cavity 125 has been formed above the rear side 102 of each optoelectronic semiconductor chip 100 embedded into the molded body 200, which cavity had previously been filled by the respective sacrificial layer 120. The ohmic contacts 110 arranged on the rear sides 102 of the optoelectronic semiconductor chips 100 are accessible through the cavities 125.

Each cavity 125 has substantially the same lateral dimensions as the rear side 102 of the associated optoelectronic semiconductor chip 100. Each cavity 125 is arranged very accurately above the rear side 102 of the associated optoelectronic semiconductor chip 100. Advantageously, the high accuracy of the positions and lateral dimensions of the cavities 125 results without necessitating correspondingly accurate positioning steps or alignment steps.

Figure 7:
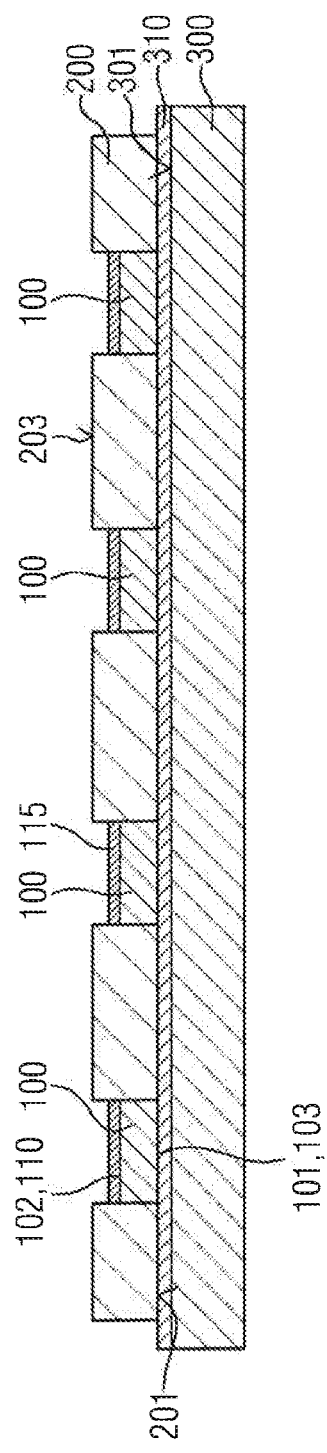
FIG. 7 shows the molded body after a metal has been deposited.

FIG. 7 shows the carrier 300 and the molded body 200 in a temporally succeeding further method state. A contact area 115 was formed on the rear side 102 of each optoelectronic semiconductor chip 100 embedded into the molded body 200. The contact area 115 of each optoelectronic semiconductor chip 100 comprises an electrically conducting material, preferably a metal. The contact area 115 of each optoelectronic semiconductor chip 100 is electrically conductively connected to the ohmic contact 110 on the rear side 102 of the respective optoelectronic semiconductor chip 100 and can serve for making electrical contact with the respective optoelectronic semiconductor chip 100.

The contact areas 115 may have been established, for example, by electroless deposition (electroless plating). The cavities 125 on the ground top side 203 of the molded body 200 in this case serve as masks. Electroless deposition advantageously enables the contact areas 115 to be established rapidly and cost-effectively. One particular advantage is that no lithographic process step is required for establishing the contact areas 115.

After the process of depositing the contact areas 115, the ground top side 203 can be subjected to surface grinding and polishing in order to obtain a surface-ground top side 204 which is flush with the contact areas 115 arranged in the cavities 125 of the molded body 200. However, the surface grinding can also be omitted.

Figure 8:
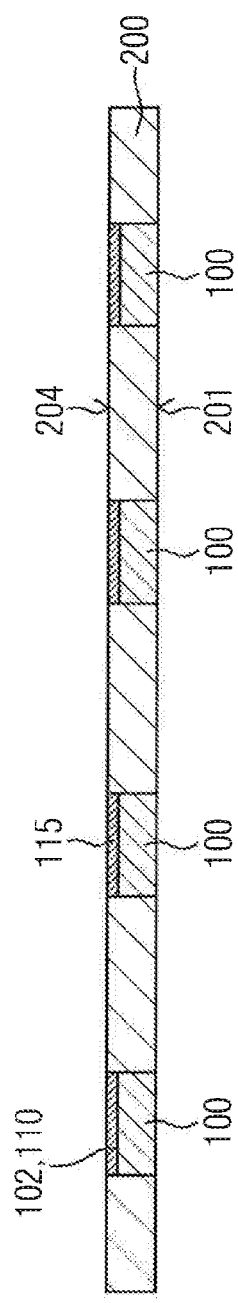
FIG. 8 shows the molded body after detachment from the carrier.

FIG. 8 shows a schematic sectional illustration of the molded body 200 in a temporally succeeding further method state. The surface-ground top side 204 of the molded body 200 is flush with the contact areas 115 on the rear sides 102 of the optoelectronic semiconductor chips 100 embedded into the molded body 200. The molded body 200 was additionally detached from the surface 301 of the carrier 300.

For detaching the molded body 200 from the carrier 300, the molded body 200 may have been detached directly from the adhesion layer 310 remaining on the top side 301 of the carrier 300. Alternatively, the adhesion layer 310 may firstly also have been detached from the surface 301 of the carrier 300 before the adhesion layer 310 was also detached from the underside 201 of the molded body 200 and the underside 201 of the molded body 200 was cleaned if necessary.

In a subsequent method step, the molded body 200 can be divided in order to obtain a plurality of optoelectronic components 10. This is illustrated schematically in FIG. 9. Each of the optoelectronic components 10 comprises part of the molded body 200 with one or a plurality of the optoelectronic semiconductor chips 100 embedded therein. The optoelectronic components 10 can be, for example, light emitting diode components, laser components or photovoltaic components.

Figure 10:
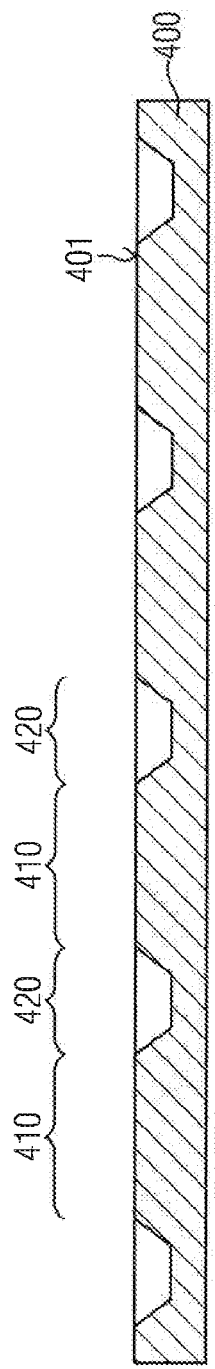
FIG. 10 shows a sectional illustration of a structured carrier in accordance with a second embodiment.

FIG. 10 shows a schematic sectional illustration of a structured carrier 400, which can be used as an alternative to the carrier 300 in FIG. 1. The structured carrier 400 can be embodied, for example, in the form of a wafer as a thin slice. The structured carrier 400 can comprise the same material as the carrier 300.

The structured carrier 400 has a structured surface 401. The structured surface 401 is laterally structured and has first lateral sections 410 and second lateral sections 420. The first lateral sections 410 are elevated relative to the second lateral sections 420 in a direction perpendicular to the surface 401 of the structured carrier 400. The difference in height between the elevated first lateral sections 410 and the recessed second lateral sections 420 of the structured surface 401 of the structured carrier 400 can be, for example, between a few micrometers and a few millimeters in a direction perpendicular to the structured surface 401.

In the example illustrated, the structured surface 401 of the molded body 400 has, in the first lateral sections 410, island-shaped elevations surrounded in each case by recessed second lateral sections 420. In the plane of the structured surface 401, the island-shaped first lateral sections 410 can be embodied in the shape of circular disks, for example. The individual first lateral sections 410 can be arranged, for example, at the nodes of a hexagonal grid in a lateral direction of the structured surface 401. However, the structured surface 401 of the structured carrier 400 could also be subdivided into elevated first lateral sections 410 and recessed second lateral sections 420 in a different way.

Figure 11:
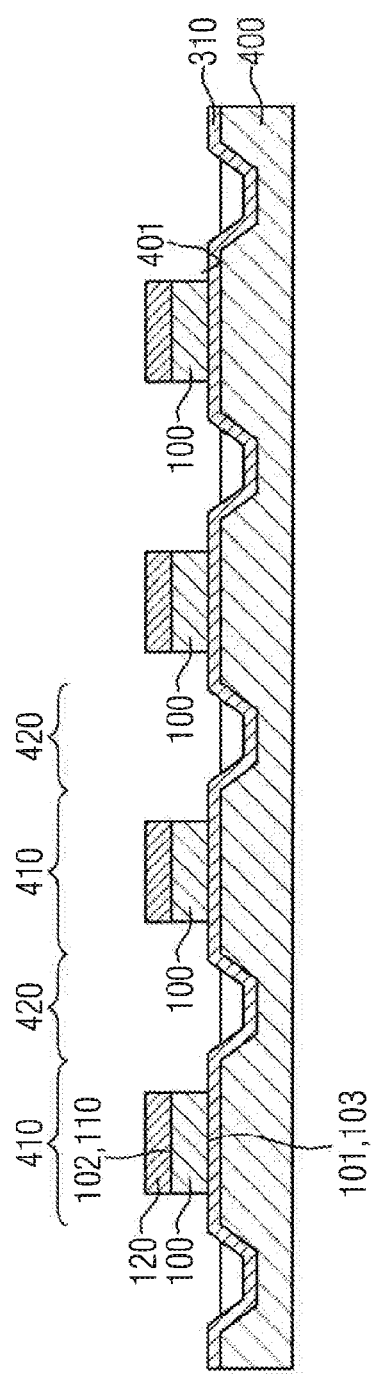
FIG. 11 shows the structured carrier with an adhesion layer arranged on the surface and optoelectronic semiconductor chips arranged thereon.

FIG. 11 shows the structured carrier 400 in schematic sectional illustration in a method state temporally succeeding the illustration in FIG. 10. An adhesion layer 310 was arranged on the structured surface 401 of the structured carrier 400, the adhesion layer corresponding to the adhesion layer 310 on the surface 301 of the carrier 300 in FIG. 2. The optoelectronic semiconductor chips 100 were subsequently arranged in the first lateral sections 410 on the adhesion layer 310 on the structured surface 401 of the structured carrier 400.

The optoelectronic semiconductor chips 100 correspond to those in FIG. 3. In particular, the optoelectronic semiconductor chips 100 in each case have a sacrificial layer 120 on their rear sides 102. The optoelectronic semiconductor chips 100 are arranged with their front side 101 in the direction of the adhesion layer 310 on the structured surface 401 of the structured carrier 400.

The optoelectronic semiconductor chips 100 may have been arranged on the structured surface 401 of the structured carrier 400 in an automated manner, for example, by means of a pick & place method. In this case, the contours of the first lateral sections 410 of the structured surface 401 may have been detected by means of image recognition in order to arrange the optoelectronic semiconductor chips 100, for example, centrally in the first lateral sections 410. Instead of a central arrangement, however, the optoelectronic semiconductor chips 100 can also be arranged at an arbitrary other position in the first lateral section 410 on the structured surface 401.

Figure 12:
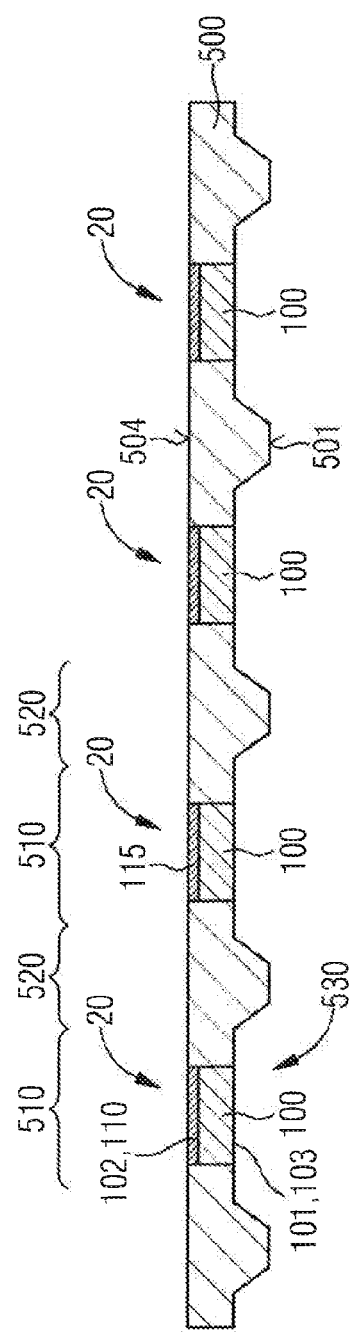
FIG. 12 shows a sectional illustration of a molded body in accordance with a second embodiment.

FIG. 12 shows a schematic sectional illustration of a structured molded body 500. The structured molded body 500 was formed above the structured surface 401 of the structured carrier 400 by means of a molding process analogously to the production of the molded body 200 explained with reference to FIGS. 4 to 8. In this case, the optoelectronic semiconductor chips 100 were embedded into the structured molded body 500. The sacrificial layers 120 on the rear sides 102 of the optoelectronic semiconductor chips 100 were kept accessible during the process of forming the structured molded body 500 or were subsequently exposed by the structured molded body 500 being partly removed. The sacrificial layers 120 were then removed. Contact areas 115 were deposited in their place. Optionally, the top side of the structured molded body 500 was subsequently subjected to surface grinding, such that the molded body now has a surface-ground top side 504 that is flush with the contact areas 115 on the rear sides 102 of the optoelectronic semiconductor chips 100. The structured molded body 500 was then detached from the structured surface 401 of the structured carrier 400.

During the process of forming the structured molded body 500 above the structured surface 401 of the structured carrier 400, the structure of the structured surface 401 was transferred as a negative to the structured molded body 500, which thus has a structured underside 501. The structured underside 501 of the structured molded body 500 has first lateral sections 510, which adjoined first lateral sections 410 of the structured surface 401 of the structured carrier 400 during the process of forming the structured molded body 500. Moreover, the structured underside 501 of the structured molded body 500 has second lateral sections 520, which adjoined second lateral 420 of the structured surface 401 of the structured carrier 400 during the process of forming the structured molded body 500.

The second lateral sections 520 of the structured underside 501 of the structured molded body 500 are elevated relative to the first lateral sections 510 of the structured underside 501. Since the first lateral sections 410 of the structured surface 401 of the structured carrier 400 form island-shaped elevations, the first lateral sections 510 of the structured underside 501 of the structured molded body 500 now form island-shaped recesses of the structured molded body 500. A front side 101 of a optoelectronic semiconductor chip 100 is accessible in each first lateral section 510. Each first lateral section 510 of the structured underside 501 of the structured molded body 500 that is surrounded by second lateral sections 520 of the structured underside 501 of the structured molded body 500 forms a cavity 530.

The structured molded body 500 can be divided in a subsequent method step in order to obtain a plurality of optoelectronic components 20. Each optoelectronic component 20 then comprises part of the structured molded body 500 having a cavity 530, at the bottom of which the front side 101 of an optoelectronic semiconductor chip 100 is accessible. It is also possible to form each optoelectronic component with more than one optoelectronic semiconductor chip 100.

The cavity 530 of each optoelectronic component 20 can be filled with a material that brings about conversion of a wavelength of an electromagnetic radiation emitted by the optoelectronic semiconductor chip 100 of the optoelectronic component 20. Preferably, such a material is arranged in all the cavities 530 of the structured molded body 500 simultaneously before the structured molded body 500 is actually divided. The material can comprise, for example, an optically transparent silicone filled with wavelength-converting particles. The particles contained in the material can also be sedimented in the direction of the front side 101 of the optoelectronic semiconductor chip 100 in the cavity 530 of an optoelectronic component 20. This is expedient, in particular, if the optoelectronic component 20 is designed for a high power.

If no wavelength conversion is desired, then the cavity 530 of each optoelectronic component 20 can also be filled merely with an optically transparent material, for example, with silicone, in order to protect the optoelectronic semiconductor chip 100. The material arranged in the cavity 530 can also be filled with only light-scattering particles, instead of with wavelength-converting particles. The light-scattering particles can serve for light mixing.

In an alternative embodiment, the wall which is formed by parts of two lateral sections 520 and which encloses the bottom region of the cavity 530 of an optoelectronic component 20, the bottom region being formed by a first lateral section 510, can serve as an optical reflector. In this case, the wall of the cavity 530 preferably has a high optical reflectivity. For this purpose, the structured molded body 500 can be formed from an optically white material, for example. Alternatively or additionally, the wall of the cavity 530 can be coated with an optically reflective material, for example, silver. The latter can be applied by an electrolytic process, for example.

In a further embodiment, the cavity 530 of each optoelectronic component 20 can serve for alignment and fixing of an optical lens. The optical lens can be embodied, for example, as a spherical lens.

Figure 13:
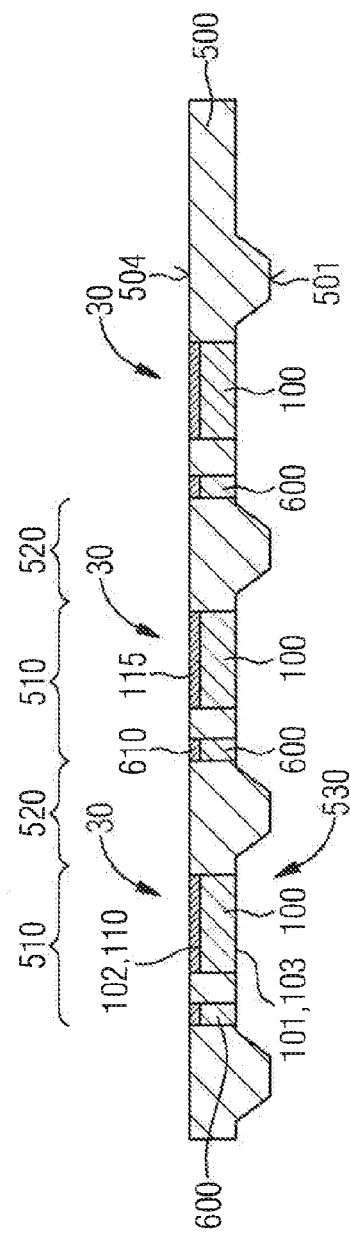
FIG. 13 shows a further illustration of the molded body from a different viewing direction.

FIG. 13 shows a schematic sectional illustration of a plurality of optoelectronic components 30 in accordance with a further embodiment. The optoelectronic components 30 are obtainable by dividing a structured molded body 500 corresponding to the structured molded body 500 in FIG. 12. The structured molded body 500 has not yet been divided in the illustration in FIG. 13.

In the illustration in FIG. 13, electrically conducting conductive elements 600 have been embedded into the structured molded body in addition to the optoelectronic semiconductor chips 100. The conductive elements comprise an electrically conducting material, for example, a metal or a doped semiconductor material. The conductive elements 600 can be embodied, for example, in the shape of pins.

The conductive elements 600 with a conductive element sacrificial layer arranged on each conductive element 600 were arranged together with the optoelectronic semiconductor chips 100 on the structured surface 401 of the structured carrier 400 and embedded into the structured molded body 500. The process of removing the conductive element sacrificial layers of the conductive elements 600 took place at the same time as the process of removing the sacrificial layers 120 of the optoelectronic semiconductor chips 100. Conductive element metallizations 610 were established on the conductive elements 600 at the same time as the contact areas 115 were established on the rear side 102 of the optoelectronic semiconductor chips 100. These are accessible on the surface-ground top side 504 of the structured molded body 500.

Alongside an optoelectronic semiconductor chip 100 a conductive element 600 is arranged in the bottom region of the cavity 530 of each optoelectronic component 30, the bottom region being formed by a first lateral section 510 of the structured underside 501 of the structured molded body 500. The respective conductive element 600 provides an electrically conducting connection between the structured underside 501 and the surface-ground top side 504 of the structured molded body 500.

An electrical contact arranged on the front side 101 of the optoelectronic semiconductor chip 100 of each optoelectronic component 30 can be electrically conductively connected to the conductive element 600 of the respective optoelectronic component 300, for example, by a bonding wire. The conductive element metallization 610 on the surface-ground top side 504 of the structured molded body 500 of the optoelectronic component 30 then provides an electrically conducting connection to the electrical contact on the front side 101 of the optoelectronic semiconductor chip 100. Together with the contact area 115 on the rear side 102 of the optoelectronic semiconductor chip 100, this makes it possible to make electrical contact with the optoelectronic semiconductor chip 100 of the optoelectronic component 30 on the surface-ground top side 504 of the part of the structured molded body 500 of the optoelectronic component 30.

The cavity 530 of each optoelectronic component 30, as in the case of the optoelectronic components 20 can serve as an optical reflector, for fixing an optical lens or for receiving a material. In this case, a bonding wire extending in the cavity 530 between the front side 101 of the optoelectronic semiconductor chip 100 and the conductive element 600 is advantageously mechanically protected by material arranged in the cavity 530.

Figure 9:
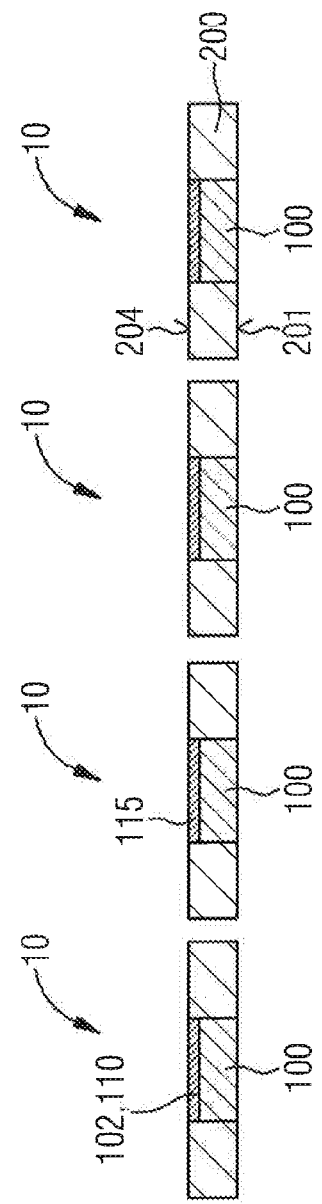
FIG. 9 shows the molded body after division into individual optoelectronic components.

The optoelectronic components 10 in FIG. 9 can also have conductive elements 600 embedded into the molded body 200 together with the optoelectronic semiconductor chips 100.

The invention has been described and illustrated more specifically on the basis of the preferred exemplary embodiments. Nevertheless, the invention is not restricted to the examples disclosed. Rather, other variations can be derived therefrom by the person skilled in the art, without departing from the scope of protection of the invention.

The invention claimed is:

1. A method for producing an optoelectronic component, the method comprising:
providing an optoelectronic semiconductor chip having a front side and rear side, wherein the front side of the optoelectronic semiconductor chip is provided for passage of electromagnetic radiation;
applying a sacrificial layer on the rear side, wherein the sacrificial layer has substantially the same lateral dimensions as the rear side;
forming a molded body, wherein the optoelectronic semiconductor chip is at least partly embedded into the molded body; and
removing the sacrificial layer, wherein an electrically conducting conductive element with a conductive element sacrificial layer arranged on the conductive element is embedded together with the optoelectronic semiconductor chip into the molded body, and wherein the conductive element sacrificial layer is removed together with the sacrificial layer.

2. The method as claimed in claim 1, wherein, before removing the sacrificial layer, the method further comprises partly removing the molded body in order to make the sacrificial layer accessible.

3. The method as claimed in claim 1, wherein the optoelectronic semiconductor chip is embedded into the molded body in such a way that the front side of the optoelectronic semiconductor chip is flush with an underside of the molded body.

4. The method as claimed in claim 3, further comprising, before forming the molded body, arranging the optoelectronic semiconductor chip on a carrier, wherein the front side of the optoelectronic semiconductor chip faces a surface of the carrier.

5. The method as claimed in claim 4, wherein a first lateral section of the surface of the carrier is elevated relative to a second lateral section of the surface of the carrier.

6. The method as claimed in claim 4, further comprising detaching the molded body from the carrier.

7. The method as claimed in claim 1, wherein the optoelectronic semiconductor chip is provided with a metallization arranged on the rear side.

8. The method as claimed in claim 7, further comprising, after removing the sacrificial layer, electrolessly depositing a metal on the rear side of the optoelectronic semiconductor chip.

9. The method as claimed in claim 8, further comprising surface grinding the metal deposited on the rear side of the optoelectronic semiconductor chip, and the molded body.

10. The method as claimed in claim 1, wherein a plurality of optoelectronic semiconductor chips are embedded together into the molded body, and wherein the molded body is divided in order to obtain a plurality of optoelectronic components.

11. The method as claimed in claim 1, wherein the front side of the optoelectronic semiconductor chip comprises a light emitting surface.

12. A method for producing a plurality of optoelectronic components, the method comprising:

adhering a plurality of optoelectronic semiconductor chips to a top side of a carrier, each optoelectronic semiconductor chip having a front side and a rear side, the rear side opposite the front side, wherein each front side faces the top side of the carrier, each front side being provided for passage of electromagnetic radiation, and wherein each rear side has a sacrificial layer formed thereon, wherein the sacrificial layers have substantially the same lateral dimensions as the rear sides;

adhering a plurality of electrically conductive elements to the top side of the carrier, each electrically conductive element comprising a sacrificial layer, wherein the electrically conductive elements are embedded together with the optoelectronic semiconductor chips into a molded body;

forming the molded body over the top side of the carrier, wherein each optoelectronic semiconductor chip is embedded in the molded body;

removing a portion of the molded body in order to expose the sacrificial layer of each optoelectronic semiconductor chip;

removing the sacrificial layer of each optoelectronic semiconductor chip;

forming a metallization on the rear side of each optoelectronic semiconductor chip;

exposing the metallization of the rear side and a surface of the front side of each optoelectronic semiconductor chip by surface grinding the molded body over the rear side and detaching the molded body from the carrier; and singulating the molded body to obtain the plurality of optoelectronic components, each optoelectronic component including an electrically conductive element.

13. The method as claimed in claim 12, wherein forming the metallization comprises electrolessly depositing a metal on the rear side of the optoelectronic semiconductor chip.

14. The method as claimed in claim 12, wherein the top side of the carrier includes a plurality of elevated sections, the optoelectronic semiconductor chips being adhered to the elevated sections.

15. The method as claimed in claim 14, wherein, after the singulating, the optoelectronic semiconductor chip of each optoelectronic component is disposed within a cavity of material of the molded body.

* * * * *